United States Patent [19]

Rice

[11] Patent Number: 5,336,391
[45] Date of Patent: Aug. 9, 1994

[54] METHOD FOR PRODUCING A CIRCUIT BOARD MATERIAL EMPLOYING AN IMPROVED ELECTROPLATING BATH

[75] Inventor: James M. Rice, Sylmar, Calif.

[73] Assignee: Ohmega Electronics, Inc., Culver City, Calif.

[21] Appl. No.: 948,476

[22] Filed: Sep. 21, 1992

Related U.S. Application Data

[60] Continuation of Ser. No. 415,721, Oct. 2, 1989, abandoned, which is a division of Ser. No. 91,990, Sep. 2, 1990, Pat. No. 4,892,776.

[51] Int. Cl.$^5$ .......................... C25D 3/56; C25D 7/06
[52] U.S. Cl. ................................... 205/152; 205/184; 205/215; 205/258; 205/920
[58] Field of Search ............... 205/258, 125, 920, 223, 205/152, 210, 215, 184

[56] References Cited

U.S. PATENT DOCUMENTS

| | | | |
|---|---|---|---|
| 2,644,787 | 7/1953 | Bonn | 204/43 |
| 3,500,926 | 3/1970 | Richardson | 166/292 |
| 4,101,389 | 7/1978 | Uedaira | 205/258 |
| 4,459,184 | 7/1984 | Kukanskis | 204/30 |
| 4,770,751 | 9/1988 | Kawagishi et al. | 204/30 |
| 4,888,574 | 12/1989 | Rice et al. | 338/309 |

OTHER PUBLICATIONS

F. A. Lowenheim, *Electroplating*, McGraw-Hill Book Co., New York, 1978, pp. 389–400.

*Primary Examiner*—John Niebling
*Assistant Examiner*—William T. Leader
*Attorney, Agent, or Firm*—Spensley Horn Jubas & Lubitz

[57] ABSTRACT

An improved circuit board material having a support layer, an electrical resistance layer and a conductive layer. The circuit board material has a resistance of at least about 500 ohms/square. The circuit board material is formed by electro-plating the electrical resistance layer on the conductive layer. The conductive layer is desirably activated prior to electro-deposition of the electrical resistance layer thereon. The conductive layer is activated by contacting with an activating agent such as benzotriazole electrolytic chromate and the like. A preferred electro-plating bath for electro-deposition of the electrical resistance layer comprises about 0.5 mole per liters nickel hypophosphite. The disclosed electro-plating bath functions at ambient temperatures and is effectively temperature independent. Circuit boards can be formed from the circuit board material through a process involving only two etching steps.

16 Claims, No Drawings

METHOD FOR PRODUCING A CIRCUIT BOARD MATERIAL EMPLOYING AN IMPROVED ELECTROPLATING BATH

This is a continuation of application Ser. No. 07/415,721 filed on Oct. 2, 1989 now abandoned, which is a divisional of application Ser. No. 07/091,990 filed on Sep. 2, 1987, now U.S. Pat. No. 4,892,776.

BACKGROUND OF THE INVENTION

1. Field of the Invention

The present invention relates to circuit board material and the method of producing said circuit board material. Specifically, the present invention relates to a circuit board material having an unusually high resistance and a novel electroplating bath, which bath is suitable for use in the production of said circuit board material possessing a high resistance.

2. Prior Art

Methods of forming circuit board material have been described in U.S. Pat. No. 2,662,957 to Eisler; U.S. Pat. No. 3,691,007 to Pavlou; and U.S. Pat. No. 3,808,576 to Castonguay et al. Additionally, improved circuit board material is described in pending U.S. patent application Ser. No. 06/738,835 filed May 29, 1985 by James Rice and assigned to Ohmega Technologies, Inc.

Typically, printed circuit board material consists of an insulating support and an outer layer of conductive material. Alternatively, the printed circuit board material consists of an insulating support layer, one or more layers of electrical resistance material and an outer layer of a conductive material. The printed circuit board stock material is converted into printed circuit boards by selective removal of unwanted layers of conductive material layers or electrical resistance layers.

U.S. Pat. No. 2,662,957 discloses electrical resistance layers comprising manganese and copper, certain copper-manganese-nickel alloys, copper-nickel alloys, nickel-silver alloys, copper-silicon alloys, copper-nickel-chromium alloys, chromium-nickel alloys and chromium-nickel-iron alloys. Additionally, U.S. Pat. No. 2,662,957 describes a general method for manufacturing the printed circuit board stock material and printed circuit boards formed therefrom.

U.S. Pat. No. 3,691,007 describes an improved method for producing printed circuit board material. Specifically, the method involves pre-coating a conductive metal foil with a porous-polymeric membrane and electro-depositing an electrical resistance layer on the conductive metal through microscopic holes in the polymeric membrane. The polymeric membrane is then removed with a solvent and the resultant bimetal foil laminated to a support layer. The method produces repeatable results from board-to-board and allows all of the resistors on a board to be made to narrow tolerances.

U.S. Pat. No. 3,808,576 describes a printed circuit board material comprising an insulating support layer and electrical resistance material adhered to said support layer and a layer of highly conductive material adhered to the electrical resistance layer. The electrical resistance layer comprises electro-plated nickel alone, or electro-plated nickel together with up to 30% by weight of phosphorus. Additionally, U.S. Pat. No. 3,808,576 describes a novel etching method for the removal of the resistive materials referred to above without the removal of copper which comprises using ferric sulfate and sulphuric acid in aqueous solution. U.S. Pat. No. 3,878,006 discloses an improved etchant for the removal of the resistive material without the removal of copper by use of cuptic sulfate.

Finally, U.S. patent application Ser. No. 06/738,835 describes an improved circuit board material comprising a support layer, at least one electrical resistance material layer, and a conductive material layer adhered to the electrical resistance material layer. The electrical resistance material layer comprises an electro-plated nickel-phosphorus composition wherein at least the top about 10 atomic layers of the electrical resistance material layer are free of sulphur. The electrical resistance material layer described in the referenced application is formed from an electro-plating bath which is essentially free of sulfate ions. Additionally, the referenced patent application describes an electro-plating bath which is substantially free of sulfate and chloride ions which electro-plating bath produces an electrical resistance material layer which is substantially continuous and pit-free and possessed of improved peel strength, resistance change after time, temperature co-efficient of resistance and current noise.

While previous circuit board materials and circuit boards formed therefrom have been found to produce useful products, it is nonetheless desirable to enhance certain aspects of the circuit board stock material and to expand the type of products capable of being manufactured therefrom. It is to this goal and others that the present invention is directed.

SUMMARY OF THE INVENTION

In a first aspect, the present invention relates to a printed circuit board material comprising a support layer, having adhered to one surface thereof an electrical resistance layer, having adhered to one surface thereof a conductive layer. The electrical resistance layer of the circuit board material of the present invention has a resistivity of greater than about 500 ohms per square.

The circuit board material of the present invention is formed by activating the conductive layer to allow electro-deposition of the electrical resistance layer on the conductive layer such that the electrical resistance layer has a resistivity of greater than about 500 ohms per square. Activating of the conductive layer is accomplished by treating the conductive layer with an activating agent including without limitation benzotriazole or electrolytic chromate.

In a second aspect, the present invention concerns an electroplating bath suitable for use at ambient temperatures which electroplating bath is particularly well adapted for use in reproduceably forming an electrical resistance layer having a resistivity of greater than about 500 ohms per square. The electroplating bath of the present invention comprises hypophosphite ion in a concentration of at least about 0.5 Molar (M/L).

The electroplating bath of the present invention has been found to produce a circuit board material having novel production characteristics. For example, the electrical resistance layer and the conductive layer can be selectively removed from the support layer in a single etching step using a known copper etchant.

DESCRIPTION OF THE PREFERRED EMBODIMENTS

The following description is the best presently contemplated mode of carrying out the invention. This description is made for the purpose of illustrating the general principles of the invention and is not to be taken in a limiting sense. The scope of the invention is best determined by reference to the appended claims.

In one aspect, the present invention is directed to a multi-layer printed circuit board material having an electrical resistance greater than about 500 ohms per square and a method of producing that material. In general, the circuit board material of the present invention has three layers: a support layer, an electrical resistance layer and a conductive layer. While three layers are typical, more than three layers are within the scope of the present invention.

The present invention concerns a circuit board material having a resistance of greater than about 500 ohms per square. Known circuit board materials generally have a resistance of from about 5 to about 200 ohms per square.

Those skilled in the art recognize that the resistance of the electrical resistance layer of a circuit board material is dependent on both the thickness of the electrical resistance layer and the resistivity of the material employed therein. As the thickness of the electrical resistance layer decreases, the resistance of said layer increases. This effect can be heightened by employing a material which has a relatively higher resistivity. Nonetheless, prior art circuit boards are not believed to have achieved the high resistance of the circuit board material of the present invention.

Prior art processes for forming circuit board material have been unsatisfactory for producing an electrical resistance material layer having a combination of resistivity and layer thickness which produces a high resistance layer and yet possesses enough structural strength to withstand the stress of formation into desirable circuit boards.

Applicant has discovered that by employing a conductive layer which has been treated with an activating agent to activate the surface of the conductive layer, it is possible to produce electrical resistance layers adhered to said activated conductive layer which electrical resistance layers are thin and have a resistance of greater than about 500 ohms per square, and which also possess the structural integrity necessary to withstand multiple etching processes.

Those skilled in the art recognize that circuit board materials are generally produced by electro-plating an electrical resistance layer onto a conductive layer and subsequently adhering said bi-layered structure to a support layer.

The activating agent of the present invention may function either to increase the adherence between the conductive layer and the electrical resistance layer or to force disproportionation of the electro-deposited material thereby changing the resistivity of the electrical resistance layer. If adherence between the conductive layer and electrical resistance layer is increased, thinner layers of electrical resistance material could be electro-deposited on the conductive layer and still maintain the desirable degree of structural integrity during an etching process. If disproportionation of the electro-deposited material is forced to deposit a material having a higher resistivity, a circuit board formed therefrom should have a higher resistance.

Suitable activating agents include any agent which is capable of performing the described function of activating the surface of the conductive layer such that an electrical resistance layer having a resistance of greater than about 500 ohms per square, can be electro-deposited on said conductive layer and subjected to subsequent etching processes while maintaining the necessary structural integrity.

Exemplary of suitable activating agents are benzotriazole, tolyltriazole, mercaptobenzothiazole, chromates, and similar compounds capable of forming a chemical complex on the surface of the conductive layer, e.g., by chemisorption.

The surface activating agent is applied to the conductive layer in an amount and manner sufficient to achieve the desired goal. Exemplary of a method suitable for applying the activating agent to the conductive layer is to form an aqueous solution of the activating agent (such as benzotriazole) and coating or dipping the conductive layer in said aqueous solution. It is hypothesized that the activating agent forms a chemical bond to the surface of the conductive layer.

In some cases, it is desirable to pre-treat the conductive material layer to ensure a clean surface prior to application of the activating agent. One preferred method suitable for performing this pre-treatment cleaning operation is to immerse the conductive layer in a hydrochloric acid solution (50 vol. % HCl) prior to activation.

In one preferred embodiment of the present invention wherein the activating agent is benzotriazole, it has been found desirable to prepare an aqueous solution of benzotriazole containing from about 50 to about 1500 parts per million, desirably from about 100 to about 1000 parts per million and beneficially from about 500 to about 1000 parts per million of benzotriazole. The conductive layer is then coated on at least one side with the benzotriazole solution. Applicant has found that this is conveniently accomplished by dipping the conductive layer in the benzotriazole solution.

When the activating agent comprises benzotriazole present in an aqueous solution in an amount of about 1000 parts per million and the conductive layer is copper metal, it has been found sufficient to produce the circuit board material of the present invention to allow the benzotriazole solution to completely wet the surface of the conductive layer for a period of time of about 30 seconds.

After the conductive layer has been activated by the activating agent of the present invention, the electrical resistance material layer is deposited thereon according to methods known in the prior art. While prior art methods of electro-depositing the electrical resistance material layer on the conductive material layer are believed generally suitable for use in the present invention, applicant has discovered that a particularly preferred circuit board material can be produced through the use of a novel electro-plating bath.

Electroplating baths used for the deposition of resistive films typically operate at a temperature significantly greater than room temperature, that is, at a temperature in excess of 100° F. (38° C.). In fact, most baths previously used to deposit resistive alloy films operate at a temperature of 150° F. (65° C.) to about 212° F. (100° C.). The thickness of the electro-deposited electrical resistance layer deposited on the conductive layer in known processes is a function of plating efficiency which is, in turn, a function of temperature. That is, as the temperature of the electro-plating bath increases, the plating efficiency increases, thus producing a decrease in resultant sheet resistance. Due to the difficulty of maintaining a consistent temperature profile during the electro-plating process, it is desirable to produce an electro-plating bath that is relatively insensitive to temperature changes. Applicant has developed such an electro-plating bath.

The electro-plating bath of the present invention comprises an aqueous solution of hypophosphite ions, and in particular, hypophosphite ions formed from nickel hypophosphite ($Ni(H_2PO_2)_2$). Nickel hypophosphite is easily prepared by the reaction of nickel carbonate ($NiCO_3$) with hypophosphorous acid ($H_3PO_2$). That is, nickel hypophosphite suitable for electro-deposition of a nickel-phosphorous electrical resistance layer on a conductive layer is prepared by forming an aqueous solution of about one-half mole of nickel carbonate and one mole of hypophosphorous acid with a limited amount of water thus producing a crystaline reaction product which completely dissolves when diluted with water to a concentration of about 0.67 moles per liter. The reaction is believed, without intending to limit the present invention, to proceed according to the following equation:

$$NiCO_3 + 2H_3PO_2 = Ni(H_2PO_2)_2 + CO_2 + H_2O$$

Alternatively, an electroplating bath comprising hypophosphite ions formed from nickel hypophosphite can be produced by the reaction of nickel chloride ($NiCl_2$) and sodium hypophosphite ($NaH_2PO_2$). The reaction equation is hypothesized to be:

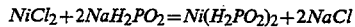

$$NiCl_2 + 2NaH_2PO_2 = Ni(H_2PO_2)_2 + 2NaCl$$

Nonetheless, it is preferred to employ an electro-plating bath formed from nickel carbonate and hypophosphorous acid with nickel-hypophosphite as a reaction product since the reaction produces by-products of carbon dioxide and water; whereas, an electro-plating bath formed from nickel chloride and sodium hypophosphite to produce nickel hypophosphite often produces a by-product of sodium chloride which must be removed to prevent undue concentration build up over time in a continuous process.

An electro-plating bath comprising hypophosphite ions formed from nickel hypophosphite has been found to be operable at temperatures from about 20° to 50° C. Often it is desirable to operate the baths of the present invention at room temperature (20° to 25° C.). Such baths are effectively temperature insensitive. Additionally, such an electro-plating bath has been found to be particularly effective for use in the present invention to electro-deposit a nickel-phosphorous electrical resistance material layer onto an activated conductive layer. The preferred nickel-phosphorous electrical resistance material layer comprises about 10–50 weight percent phosphorous, most preferably 30–50 weight percent phosphorous.

As set forth above, the activating agent may serve to force disproportionation of the material electroplated on the conductive layer as an electrical resistance layer. For example, when the nickel hypophosphite bath is used, the activating agent may force a higher concentration of phosphorous to plate on the conductive layer. That is, if the nickel hypophosphite bath would plate nickel-phosphorous (85–15 percent by weight) on a non-activated conductive layer, the same bath may plate nickel-phosphorous (50–50) on an activated conductive layer.

Since a nickel-phosphorous (50–50) material would have a greater resistivity than a nickel-phosphorous (85–15) material, the greater resistance of the circuit board material of the present invention can be achieved in this manner. It is likely that in some instances, the activating agent functions to allow a thinner deposition of higher resistivity material which higher resistivity material is formed by disproportionated electro-deposition.

Applicant surprisingly discovered that circuit board materials produced according to the present invention possess certain physical characteristics that distinguish them from prior art circuit board materials and render them more desirable for use. Specifically, circuit board materials according to the present invention only require a two-step etching process in order to produce circuit boards therefrom.

In the past, circuit board stock material was converted into circuit boards through an involved process. Specifically, the conductive layer surface of the material was coated with a photoresist agent which was exposed through a photographic negative containing the combined conductor and resistor patterns. The exposed photoresist was developed leaving the composite resistor/conductor pattern protected. The exposed copper was etched with a conventional copper etchant. The circuit board material was rinsed in water and immersed in a second selective etchant until the exposed resistor layer was removed. The remaining photoresist was stripped away and the panel was again coated with a photoresist and exposed to protect the conductor pattern. The exposed photoresist was developed and the panel was etched in a selective copper etchant until the bare copper was removed. The circuit board material was again rinsed, the remaining photoresist stripped away and the board dried. At this point, the conductive and resistive elements were defined and in electrical contact with each other.

As evident from the above description, known processes for converting printed circuit board material into printed circuit boards involve three separate etching processes.

Circuit board materials, according to the present invention, only require two separate etching steps to convert the circuit board material into usable circuit boards. Specifically, the circuit board material of the present invention is coated, on the conductive layer, with a photoresist which is then exposed through a photographic negative containing the combined conductor and resistor patterns. The exposed photoresist is developed leaving the composite resistor/conductor pattern protected. Through a single etching process, the exposed conductive layer and electrical resistance layer present thereunder, is removed. The etchant used to remove both the conductive layer and the electrical resistance layer is suitably the same etchant normally employed to remove only the conductive material layer. Since the conductive material layer traditionally comprises copper, conventional copper etchants are suitably employed to remove both the conductive material layer and the electrical resistance material layer of the present invention.

After this first etching step, the remaining photoresist is stripped away and the panel is again coated with a photoresist and exposed to protect the conductor pattern. The exposed photoresist is developed and the panel is etched in a selective etchant suitable for removal of the conductive material layer until the conductive layer is removed. Those skilled in the art will recognize the significant production advantages achievable by the elimination of the separate etching step to remove the electrical resistance material layer.

Exemplary of conventional copper etchants are those commonly used in the industry including alkaline and acidic etchants such as persulfates, sulfuric-peroxide, and chloride based etchants, such as ferric chloride and cupric chloride, for use in removing both the conductive layer and the electrical resistance layer. The preferred conventional copper etchant is cupric chloride. The preferred selective etchant to remove copper from the electrical resistance layer is chromic acid.

Materials suitable for use as the conductive layer are known to those skilled in the art. The preferred material for use as the conductive layer is copper or a copper alloy.

Similarly, materials suitable for use as the support layer are known to those skilled in the art. The support layer should be generally non-conducting. Exemplary of suitable material for use as the support layers are organic polymeric materials, reinforced epoxies and the like.

The following examples are intended to illustrate the present invention and are not to be construed so as to limit the invention as set forth in the claims and specification.

EXAMPLES

In the following examples a batch process is employed with the plating cell remaining constant. Mild agitation is provided in the plating cell by a recirculating pump to maintain uniform bath composition. The cathode employed is electro-deposited one ounce copper foil which is plated on the matte side. The shiny or drum side of the foil is masked by a rubber coated backing fixture. The cathode size is 11.5 inches by 14.25 inches. The anode is platinum clad columbium with an anode to cathode ratio of 1.3:1. Prior to passing into the plating cell, the copper foil is immersed in an aqueous hydrochloric acid solution (equal volume) for one minute. The copper foil is then passed through an activating solution comprising an aqueous solution of benzotriazole for 30 seconds prior to passing through the plating cell. The support layer is a reinforced epoxy.

EXAMPLE 1

A plating bath is formed which comprises 0.5 moles per liter of nickel hypophosphite. The plating bath is made by reacting 20 moles of nickel carbonate (2508 grams of basic nickel carbonate, $NiCO_3 \cdot 2Ni(OH)_2 \cdot 4H_2O$, mol. wt. 376.24) with 40 moles of hypophosphorous acid (8.6 liters of 50% $H_3PO_2$ at 9.3 M/L diluted with an equal volume of water) and subsequently diluting the reaction product to 40 liters. The temperature of the plating bath, after cooling to room temperature, is 23° C., the current is 10 amperes, and the plating bath dwell time is 30 seconds. The resistance of the plated material is set forth in Table 1 as a function of benzotriazole concentration which is varied from 0 to 100 parts per million.

TABLE 1

| Concentration of Benzotriazole, ppm | Resistivity, $R_s$ Ohms per square |
| --- | --- |
| 0 | 140 |
| 5 | 240 |
| 10 | 305 |
| 15 | 380 |
| 20 | 430 |
| 25 | 470 |

TABLE 1-continued

| Concentration of Benzotriazole, ppm | Resistivity, $R_s$ Ohms per square |
| --- | --- |
| 30 | 510 |
| 35 | 570 |
| 40 | 610 |
| 45 | 660 |
| 50 | 700 |
| 100 | 1050 |

As can be seen from Table 1, the resistance of the plated material is directly related to the concentration of benzotriazole.

EXAMPLE 2

The procedure of Example 1 is repeated employing the same plating bath as employed in Example 1, a benzotriazole concentration of 1000 parts per million, a plating bath dwell time of 30 seconds, and a plating bath temperature of 26° C. However, the current is varied between about 5 amperes and 20 amperes. The effect of the variation in current on resistance is set forth in Table 2.

TABLE 2

| I, AMPERES | $R_s$, OHMS/SQ. | THICKNESS, Å |
| --- | --- | --- |
| 5 | 443,485 | 135 |
| 7.5 | 20,850 | 210 |
| 10 | 2,360 | 320 |
| 12.5 | 508 | 415 |
| 15 | 225 | 560 |
| 17.5 | 138 | 616 |
| 20 | 105 | 680 |

I = Current in amperes,
$R_s$ = Sheet resistivity, ohms per suare
Å = Thickness in angstroms determined by x-ray fluorescene As can be seen from Table 2, as current increases, the resistance of the resultant deposited material decreases.

EXAMPLE 3

The procedure of Example 2 is repeated employing the same conditions, except for the use of benzotriazole (0 ppm). The effect of the current on resistance is set forth in Table 3.

TABLE 3

| I, AMPERES | $R_s$, OHMS/SQ. |
| --- | --- |
| 5 | 420 |
| 7.5 | 238 |
| 10 | 148 |
| 12.5 | 82 |
| 15 | 50 |
| 17.5 | 33 |
| 20 | 24.5 |

I = Current in amperes
$R_s$ = Sheet resistivity, ohm per square.

Comparison of Table 2 and 3 indicates the effect of pretreatment with a surface activating agent. For example, at higher current density (20 amperes), pretreatment with benzotriazole (1000 ppm) produces a sheet resistivity of 105; without the pretreatment, a sheet resistivity of 24.5 is produced. Thus, the ratio of resistivities is about 4:1 (105/24.5). At a lower current density (5 amperes), pretreatment with benzotriazole (1000 ppm) produces a sheet resistivity of 443,485; without the pretreatment, a sheet having a resistivity of 420 is produced. Thus, at low current density the ratio of resistivities is about 1000:1.

The bath of the present invention is able to produce resistive films having resistivities of from about 10 ohm/square to about 1 megaohm/square (1,000,000 ohm/square).

What is claimed is:

1. In a method for preparing a circuit board material comprising a conductive layer having an electrical resistance material layer electroplated thereon, the improvement comprising electro-plating a nickel-phosphorus electrical resistance layer on said conductive layer using an electroplating bath consisting essentially of at least about 0.25 moles per liter nickel ions and at least about 0.05 moles per liter hypophosphite ions at a temperature within the range of from about 20° to 50° C., wherein said electrical resistance layer comprises about 10 to about 50 percent by weight of phosphorus.

2. The method of claim 1 wherein said nickel and hypophosphite ions are formed by reacting nickel carbonate and hypophosphorous acid.

3. The method of claim 1 wherein said nickel and hypophosphite ions are formed by reacting nickel chloride and sodium hypophosphite.

4. The method of claim 1 wherein said electrical resistance layer has an electrical resistance of at least 500 ohms per square.

5. The method of claim 1 wherein said conductive layer comprises copper metal.

6. The method of claim 1 wherein said electrical resistance layer comprises about 30 to about 50 percent by weight of phosphorus.

7. The method of claim 1 wherein said conductive layer is treated with an activating agent prior to electroplating said electrical resistance layer.

8. The method of claim 7 wherein said activating agent is selected from the group consisting of benzotriazole, tolyltriazole, mercaptobenzothiazole, chromates and mixtures thereof.

9. The method of claim 8 wherein said activating agent is benzotriazole.

10. A method of preparing a circuit board material comprising a conductive layer having a nickel-phosphorus electrical resistance layer electroplated thereon, the method comprising the following steps:
   forming an electro-plating bath consisting essentially of at least about 0.25 moles per liter nickel ions and at least about 0.50 moles per liter hypophosphite ions;
   immersing said conductive layer in said bath;
   electro-depositing said electrical resistance layer on said conductive layer by applying a voltage to said a bath at a temperature within the range of from about 20° to 50° C., wherein said electrical resistance layer comprises about 10 to about 50 percent by weight of phosphorus; and
   adhering said electrical resistance layer electro-deposited on said conductive layer to a support layer to form said circuit board material.

11. The method of claim 10 wherein said conductive layer comprises copper metal.

12. The method of claim 10 wherein said electrical resistance layer comprises about 30 to about 50 percent by weight of phosphorus.

13. The method of claim 10 wherein said conductive layer is treated with an activating agent prior to said immersion step.

14. The method of claim 13 wherein said activating agent is selected from the group consisting of benzotriazole, tolyltriazole, mercaptobenzothiazole, chromates and mixtures thereof.

15. The method of claim 14 wherein said activating agent is benzotriazole.

16. The method of claim 10 wherein said electrical resistance layer has an electrical resistance of at least 500 ohms per square.

* * * * *